(12) United States Patent
Kanesaka

(10) Patent No.: US 6,320,280 B1
(45) Date of Patent: Nov. 20, 2001

(54) ELECTRONIC DEVICE FITTED WITH POWER GENERATORS

(75) Inventor: Toshiya Kanesaka, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/237,232

(22) Filed: Jan. 26, 1999

(51) Int. Cl.⁷ .................................................. G04B 1/00
(52) U.S. Cl. ........................... 307/72; 368/203; 307/84
(58) Field of Search ................................. 307/43, 72, 84, 307/85; 368/203, 204, 205; 968/889, 891, 893

(56) References Cited

U.S. PATENT DOCUMENTS

| | | | |
|---|---|---|---|
| 4,165,477 | * 8/1979 | Comte | 307/72 |
| 4,291,266 | * 9/1981 | Portmann | 368/205 |
| 5,705,770 | * 1/1998 | Ogasawara et al. | 368/204 |
| 5,901,117 | * 5/1999 | Delabre | 368/276 |

* cited by examiner

Primary Examiner—Josie Ballato
Assistant Examiner—Roberto Rios
(74) Attorney, Agent, or Firm—Adams & Wilks

(57) ABSTRACT

An electronic device has a housing having a first transparent surface and a second transparent surface opposite to the first transparent surface. A timepiece movement is disposed in the housing and has a display for displaying time through the first transparent surface of the housing. A thermoelectric generator is disposed in the housing for generating electric power in response to a temperature difference across the thermoelectric generator. At least one solar generator is disposed on the second transparent surface of the housing for receiving light transmitted through the second transparent surface to generate electric power. An electrical power storage device stores electric power generated by at least one of the thermoelectric generator and the solar generator and supplies the electric power to the timepiece movement.

10 Claims, 6 Drawing Sheets

ELECTRONIC DEVICE FITTED WITH POWER GENERATORS

BACKGROUND OF THE INVENTION

1. Field of the Invention

The present invention relates to various kinds of electronic devices and appliances such as electronic wristwatches, portable communications devices, and domestic electrical appliances and, more particularly, to electronic devices fitted with power generators.

2. Description of the Prior Art

Heretofore, electronic devices fitted with power generators have been developed as electronic devices such as electronic wristwatches and the like. Various types are available as power generators. Especially, thermoelectric generators can be made compact and so they are being developed so as to be applied to various electronic devices and appliances.

An electronic wristwatch fitted with a thermoelectric generator is worn on an arm such that suction of heat by the thermoelectric generator is conducted from the arm. Heat is dissipated to the outside air. In this way, electric power is generated by making use of a temperature difference. Accordingly, when the electronic wristwatch is detached from the arm, no temperature difference is produced and so power generation may be stopped. If power generation is stopped for a long time, electric power stored in a storage device might be exhausted. Furthermore, when the outside air temperature and the body temperature on the arm become equal, power generation comes to a stop. In this case, there is the possibility that the electric power stored in the storage device is used up.

Since a thermoelectric generator produces only a small amount of electric power, if the storage device is exhausted, it is difficult to store a sufficient amount of electric power in the storage device is a short time after attaching the watch to an arm. For example, where a thermoelectric device has a temperature difference of about 2° C., the electric power that can be generated is about 13.3 $\mu$W, provided that the generated voltage is 0.4 V, the internal resistance is about 1500 $\Omega$, and the input impedance of a voltage step-up means for stepping up the generated voltage is 1500 $\Omega$ and that the loss of the voltage step-up means is neglected. The electric power consumed by the electronic wristwatch is approximately 1 to 2 $\mu$W. Where a lithium-ion secondary battery having a diameter of 6 mm is used as a power storage device, energy of about 6.5 J can be stored. Accordingly, if the device is worn on an arm and should be fully charged, it takes a time of 135.8 hours even if consumption and loss in the load circuit are neglected.

Accordingly, if power generation of the thermoelectric generator is stopped for a long time as encountered when the electronic wristwatch is detached from the arm, the electric power storage device is exhausted. This brings the timepiece to a stop.

One proposed method for solving this problem is to reduce the frequency at which the second hand of a watch or clock is driven if the storage voltage drops, thus lowering the electric power consumed (see Patent Unexamined Publication No. 287080/1995). With this method, the electric power consumed can be decreased but cannot be reduced down to zero. Therefore, if power generation of the thermoelectric generator stops for a long time, there arises the problem that the storage device is exhausted.

If a thermoelectric generator is used in various electronic devices and appliances other than electronic wristwatches such as portable communications devices and domestic electric appliances, the same problem arises if no temperature difference occurs.

The present invention is intended to suppress decreases in the electric power stored in an electrical storage device of an electric device having a thermoelectric generator.

SUMMARY OF THE INVENTION

An electronic device fitted with power generators in accordance with the present invention is characterized by comprising: a thermoelectric generator; a solar generator; a switching means for delivering at least one of electric power generated by said thermoelectric generator and electric power generated by said solar generator; an electric energy storage means charged by output from said switching means; and an electronic device body circuit powered by said electric energy storage means. If there is a temperature difference, the thermoelectric generator generates electricity. The solar generator receives light such as sunlight and generates electricity. At least one of the electric power generated by the thermoelectric generator and the electric power generated by the solar generator is supplied to the storage means via the switching means, thus charging the storage means. The electronic device body circuit is powered by the storage means.

Accordingly, in regions where large temperature differences are obtained but the sunlight is weak and the hours of sunlight are short as in cold regions, the device can be chiefly charged by the thermoelectric generator. On the other hand, in areas where large temperature differences cannot be derived but the sunlight is strong and the hours of sunlight are long as in the vicinities of equatorial districts, the device can be mainly charged by the solar generator. Therefore, the drawbacks of the power generators can be compensated by using the thermoelectric generator and the solar generator in combination. The storage device can be charged without being affected greatly by regional environments. Decreases in the electric power stored in the storage means can be suppressed.

The voltage generated by the thermoelectric generator described above is relatively low and rises mildly. On the other hand, the voltage generated by the solar generator is relatively high and rises steeply. Therefore, it is desired to use the solar generator to power the voltage step-up means that steps up the voltage generated by the thermoelectric generator.

Since the voltage generated by the thermoelectric generator is comparatively low, if the voltage of the thermoelectric generator is insufficient to start the voltage step-up means, the solar cell generator is made of one stage of cell and used as a power supply for starting the voltage step-up means. After starting the voltage step-up means, the voltage generated by the thermoelectric generator is stepped up and used to power the voltage step-up means. In this way, the solar generator is used.

The aforementioned electric device body circuit can comprise an electronic timepiece circuit and a display means driven by the electronic timepiece circuit to provide a display of time.

The solar generator is disposed on the time display face of the display means. In normal use, the solar generator can be made to produce electricity and thus the device is charged.

The solar generator is disposed on the opposite side of the time display face of the display means so as to be capable of receiving light via a transparent rear cover. Hence, the appearance of the electronic device can be aesthetically improved.

DESCRIPTION OF THE DRAWINGS

A preferred form of the present invention is illustrated in the accompanying drawings in which.

DETAILED DESCRIPTION OF THE PREFERRED EMBODIMENTS

Figure 1:
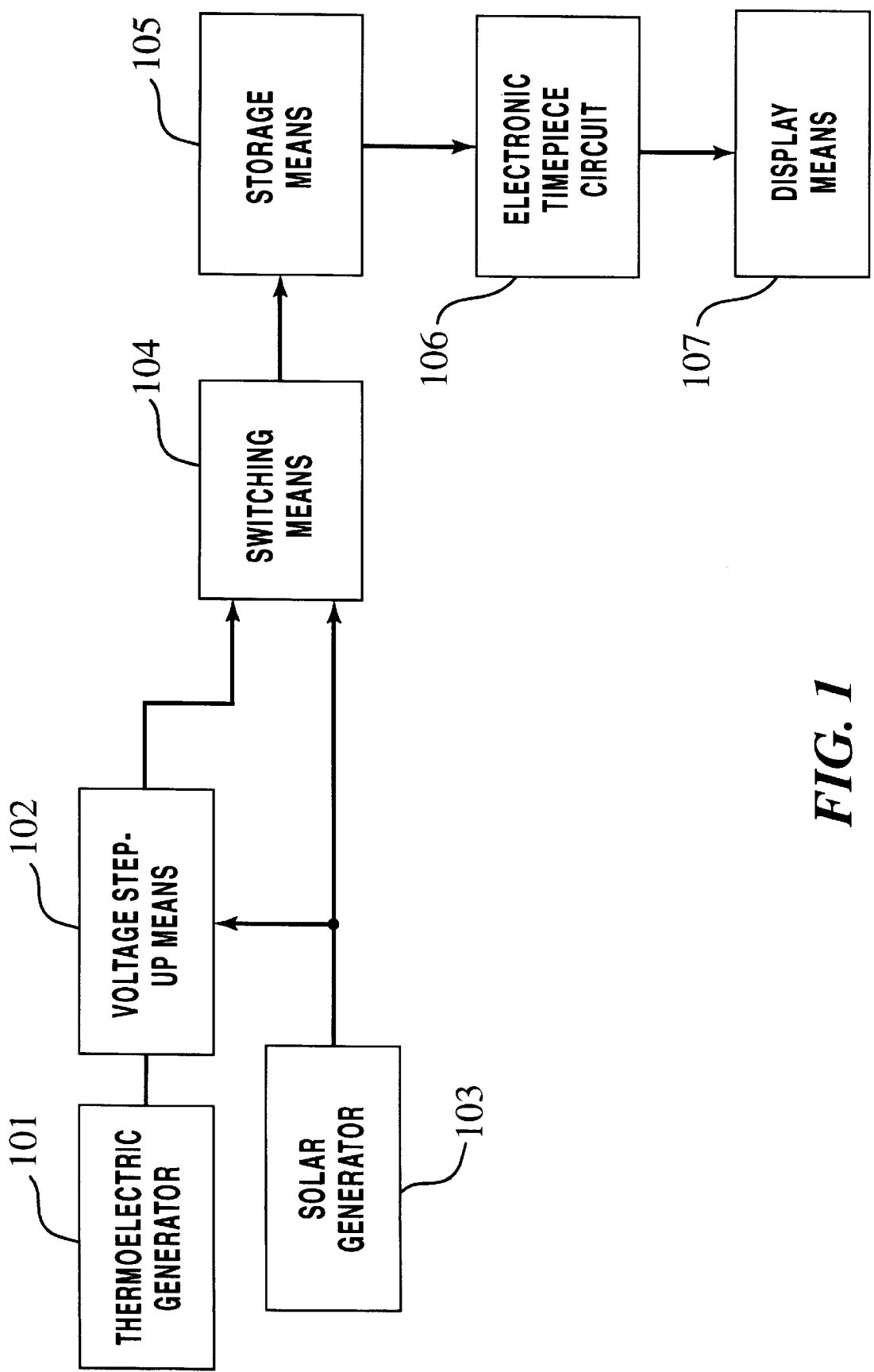
FIG. 1 is a block diagram of an electronic wristwatch fitted with power generators in accordance with the present invention.

FIG. 1 is a block diagram showing an embodiment of the present invention, depicting an example of an electronic wristwatch fitted with power generators. In FIG. 1, a thermoelectric generator 101 has an output portion connected with a first input portion of a switching means 104 via a voltage step-up means 102. A solar generator 103 has an output portion connected with a second input portion of the switching means 104 and with the power-supply terminals of the voltage step-up means 102. The output portion of the switching means 104 is connected with an electrical storage means 105. The output portion of the storage means 105 is so connected as to act as a power supply for an electronic timepiece circuit 106 and a display means 107. The electronic timepiece circuit 106 and the display means 107 form an electronic device body circuit. The power-supply terminals of the voltage step-up means 102 are connected also with the storage means 105 such that it can also be fed from the storage means 105 in a manner not shown.

The details of the construction of the thermoelectric generator 101 will be described later. Since it is difficult to directly drive the electronic timepiece circuit 106 and the display means 107 by the voltage generated by the thermoelectric generator, the voltage generated by the thermoelectric generator 101 is stepped up by the voltage step-up means 102 to a voltage sufficient to drive the electronic timepiece circuit 106 and the display means 107, thus electrically charging the storage means 105. One suitable example of the voltage step-up means 102 is a switched capacitor configuration consisting of a plurality of capacitors connected in parallel. These capacitors are charged in this condition. These capacitors are switched to a series connection by a switching device to produce a stepped up voltage. In this way, the operation for generating a stepped up voltage is repeated. In another suitable example, the current flowing through a coil is turned on and off by a switching device. The voltage is stepped up by making use of a self-induction current induced in the coil. This is adapted for miniaturization. The storage means 105 can be a lithium secondary battery, electric double-layer capacitors, or the like.

The electronic timepiece circuit 106 uses a quartz oscillator circuit to generate 32,768 Hz. This is divided down to 1 second by a frequency divider circuit to drive a stepping motor every second. This rotates the second hand, the minute hand, and the hour hand forming the display means 107, thus displaying time.

The operation of the embodiment constructed in this way is described below.

When one wears the electronic wristwatch on its arm, the thermoelectric generator 101 produces electricity utilizing a temperature difference between the body temperature on the arm and the outside temperature. The voltage generated by the thermoelectric generator 101 is stepped up by the voltage step-up means 102, and then supplied into the storage means 105 via the switching means 104 to charge the storage means 105.

On the other hand, the solar generator 103 receives light such as sunlight and generates electricity. The generated electric power is supplied to the storage means 105 via the switching means 104 to charge the storage means 105.

Where the thermoelectric generator 101 and the solar generator 103 simultaneously generate electricity, the storage means 105 is charged from both generators via the switching means 104.

The solar generator 103 produces a large amount of electric power. Furthermore, the voltage generated rises steeply. The solar generator has these characteristics. Where the solar generator 103 consists of four stages of amorphous silicon solar cells connected in series having a size measuring 1 cm in height and 2.5 cm in width, the generator produces electric power of about 6 $\mu$W at 200 lux. Since the brightness of the outdoors on a cloudy day are about 10,000 lux, the amount of power generated is about 300 $\mu$W, which is about 22 times as high as the amount of electric power thermally generated, though this may vary depending on the area and the efficiency of the cells.

Accordingly, the voltage step-up means 102 can be driven, if the storage voltage of the storage means 105 is so lower that the voltage step-up means 102 cannot be driven, by starting the voltage step-up means 102 using the output from the solar generator 103 as a power supply. The output from the thermoelectric generator 101 can stepped up to a required voltage and the storage means 105 can be charged. After the voltage step-up means 102 starts to operate and the storage means 105 becomes charged, the voltage step-up means 102 can be operated by the storage means 105. Therefore, if the power generation of the solar generator 103 is stopped, the voltage step-up means 102 stably operates.

If the storage means 105 is charged, the electronic timepiece circuit 106 and the display means 107 are powered by the storage means and time is displayed.

Figure 2:
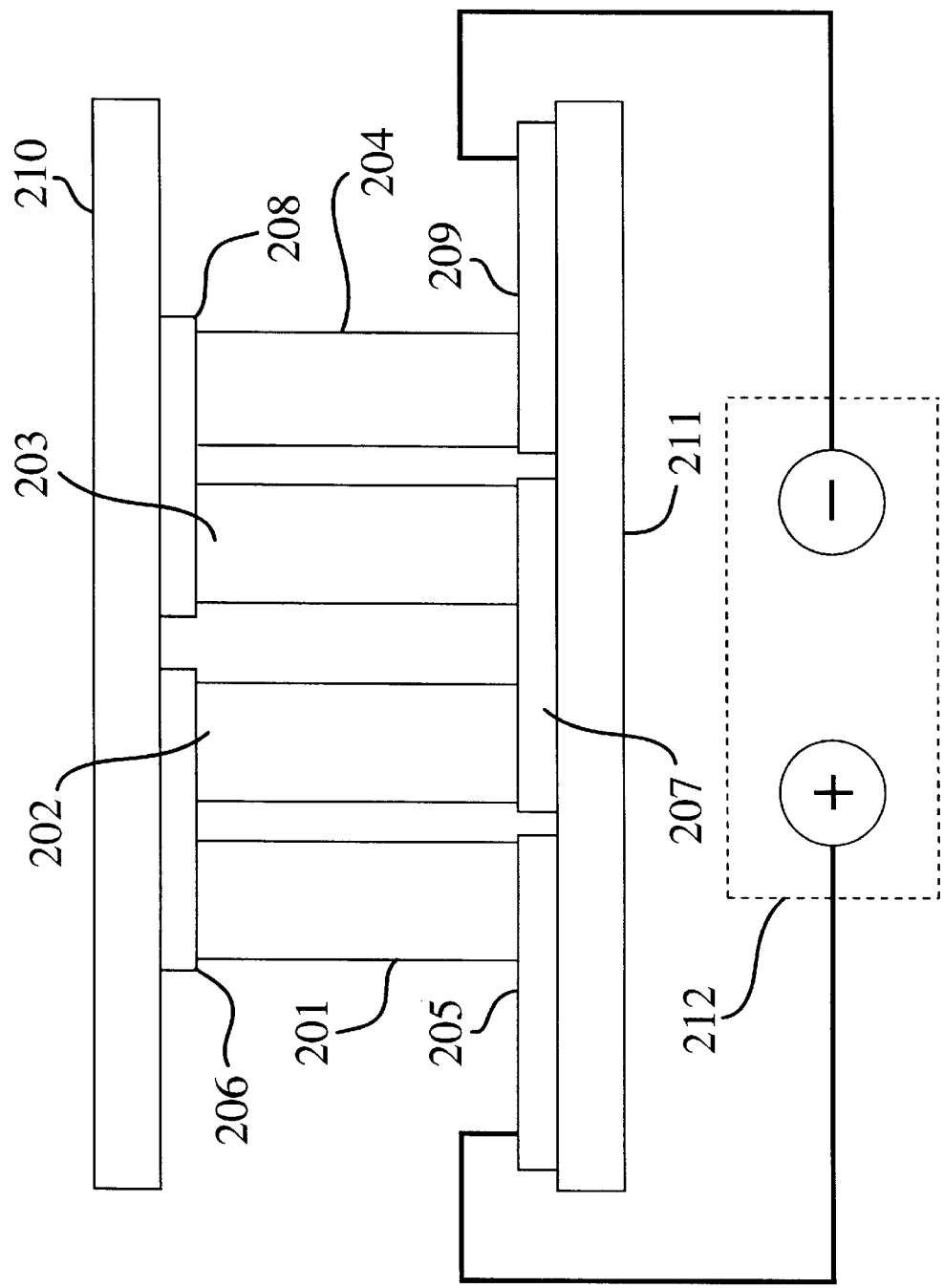
FIG. 2 is a side elevation showing the structure of the thermoelectric generator of FIG. 1.

FIG. 2 is a side elevation showing the structure of the thermoelectric generator 101. This shows an example of thermoelement utilizing the Seebeck effect. In FIG. 2, electrodes 205–209, N-type semiconductor thermoelements 201, 203, and P-type semiconductor thermoelements 202, 204 are alternately connected. The electrodes 206 and 208 are firmly mounted to an insulating board 210. The electrodes 205, 207, and 209 are rigidly affixed to an insulating board 211. The electrodes 205 and 209 are connected with output terminals 212. In the thermoelectric generator constructed as described above, if the insulating board 210 is made cooler and the insulating board 211 is made hotter, electric power is developed across the output terminals 212 with polarities as shown. Where this thermoelectric generator is used in an electronic wristwatch, if this wristwatch is worn on an arm, the body temperature on the arm is transmitted to the insulating board 211. The insulating board 210 is at the outside temperature. Electric power is generated owing to a temperature difference between the body temperature described above and the outside temperature.

In the example shown in FIG. 2, two pairs of P-type and N-type semiconductor thermoelements are used. A higher voltage can be produced by connecting tens of pairs of thermoelements, hundreds of pairs of thermoelements, or thousands of pairs of thermoelements in series. Where each semiconductor thermoelement is made of an alloy containing bismuth and tellurium, each pair of PN semiconductor thermoelements can generate a voltage of 200 $\mu$V at a temperature difference of 1° C.

Figure 3:
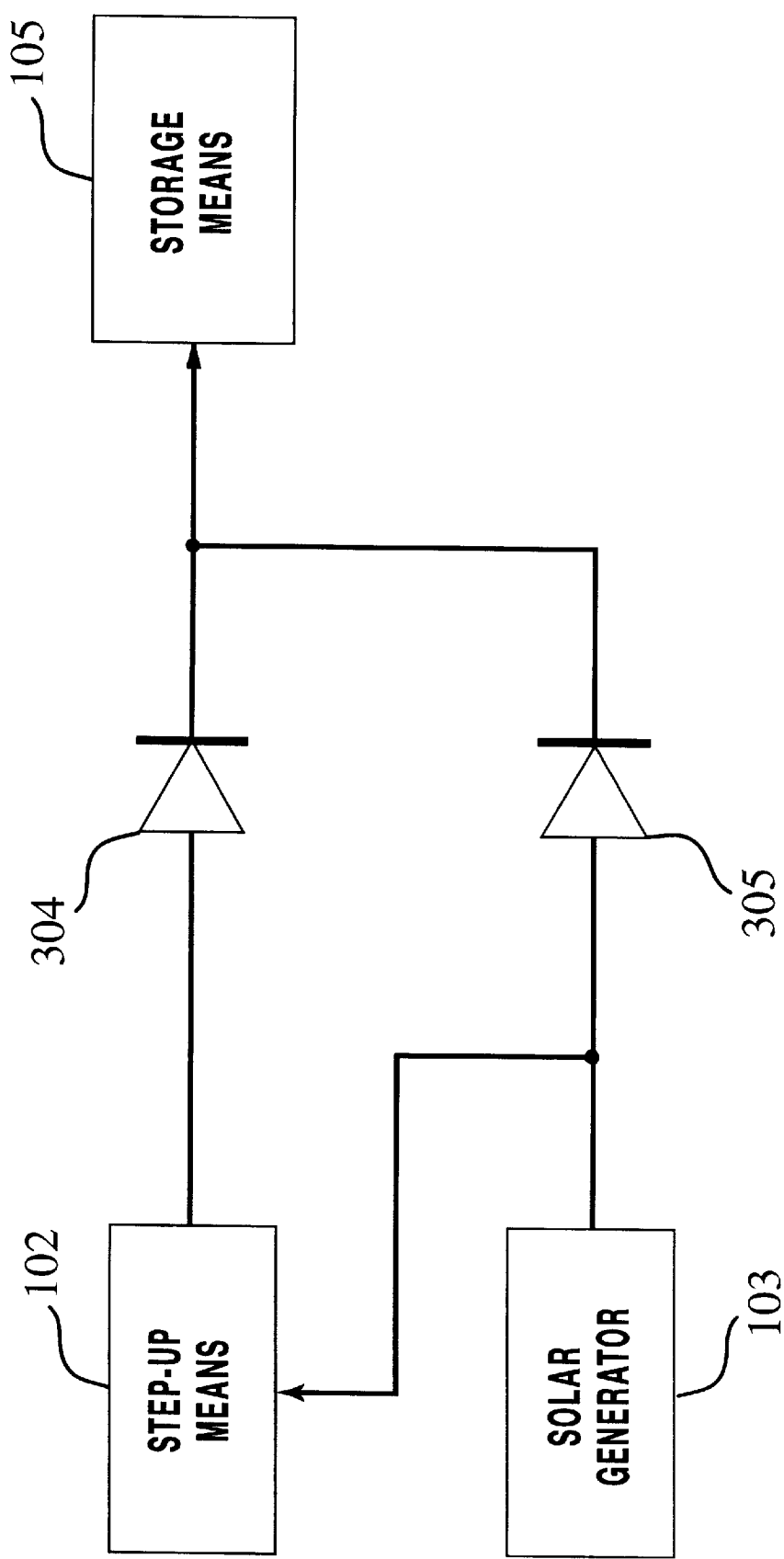
FIG. 3 is a view showing details of a circuit forming the switching means of FIG. 1.

FIG. 3 is a circuit diagram showing the details of the switching means 104, which comprises diodes 304 and 305. The diode 304 acts to prevent reverse current to the voltage step-up means 102. The diode 305 serves to prevent reverse current to the solar generator 105.

The voltage step-up means 102 steps up the voltage generated by the thermoelectric generator 101 and charges the storage means 303 via the diode 304. The solar generator 103 receives light, generates electricity, and charges the storage means 105 via the diode 305.

Where the thermoelectric generator 101 and the solar generator 103 simultaneously generate electricity, the generated electricity is supplied to the storage means 105 via the diodes 304 and 305, respectively. Thus, the storage means 105 is charged by the electric power from both generators.

Besides the switching means 104 described above, electronic switches such as MOS transistors can be used as the switching means 104. It may also be a mechanical switch operated externally.

Figure 4:
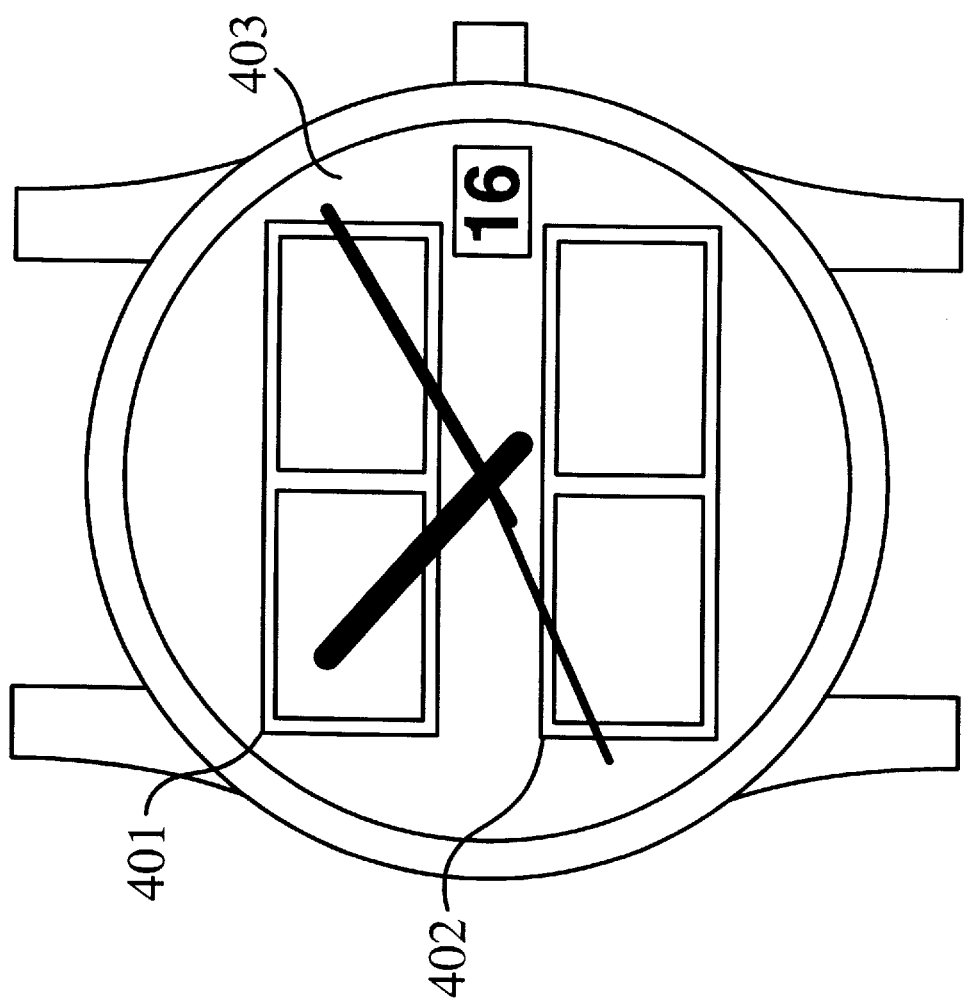
FIG. 4 is a plan view showing the structure of an electronic wristwatch fitted with power generators in accordance with the invention.

FIG. 4 is a plan view showing the structure of one embodiment of the present invention, depicting an example of electronic wristwatch fitted with power generators. In FIG. 4, a first solar generator 401 and a second solar generator 402 are disposed on the dial 403 forming a time display face. These generators are electrically connected in series. Since each of the solar generators 401 and 402 is composed of two stages, there exist four stages in total. Since each stage produces a voltage of about 0.7 V, a voltage of about 2.8 V is generated in total. A thermoelectric generator (not shown) is incorporated in the electronic wristwatch. Where the wristwatch is worn on an arm, electricity is generated owing to a temperature difference between the body temperature and the outside temperature.

Figure 5:
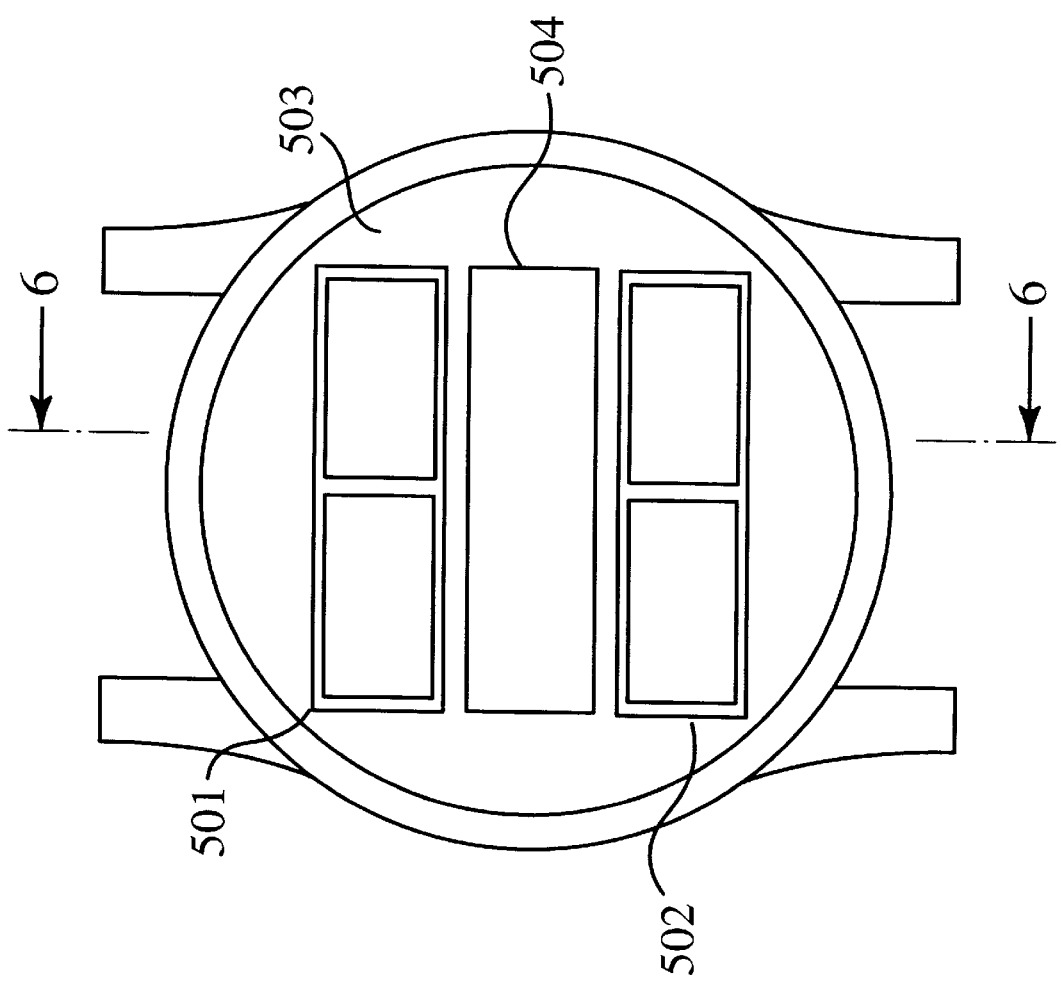
FIG. 5 is a bottom view showing the structure of another embodiment of an electronic wristwatch fitted with power generators in accordance with the invention.
Figure 6:
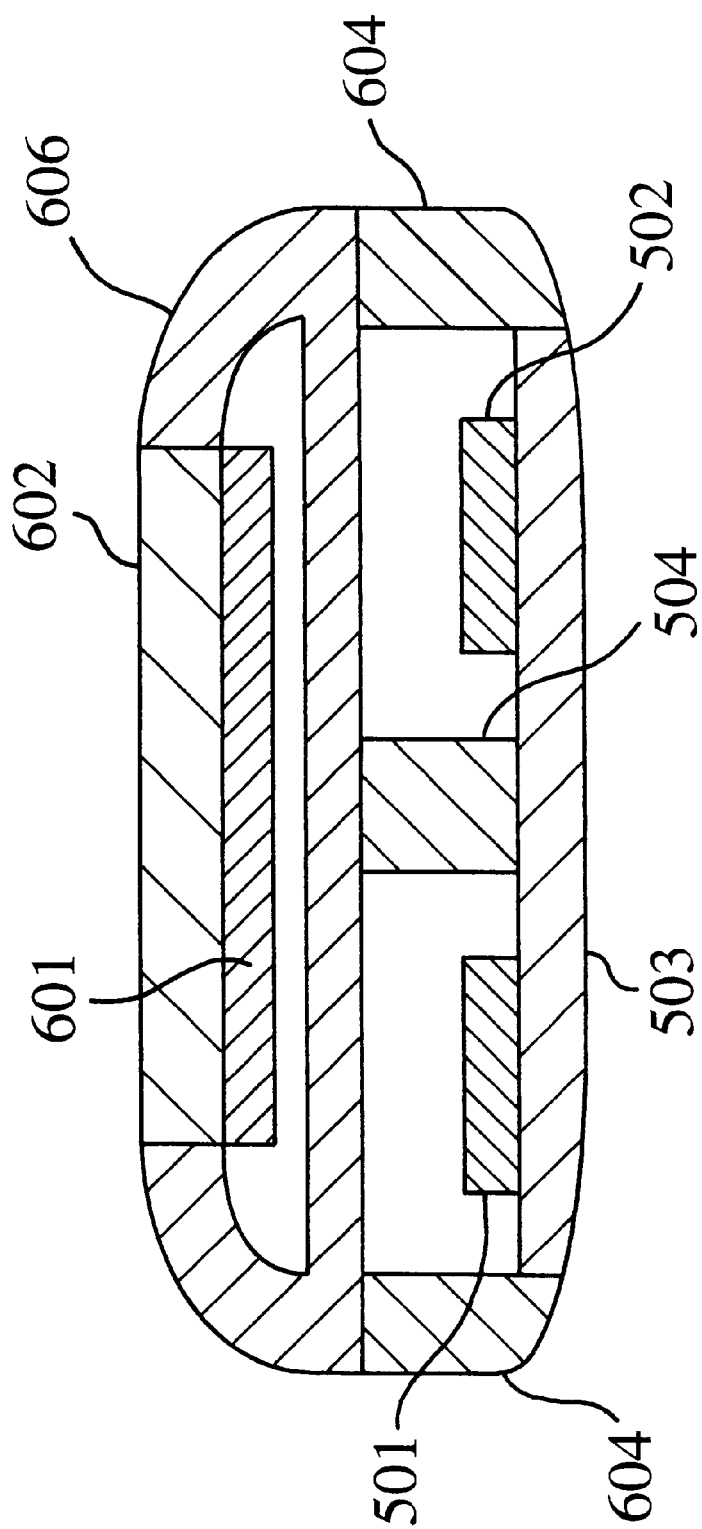
FIG. 6 is a cross-sectional view of the electronic wristwatch fitted with power generators and shown in FIG. 5, taken on 6—6.

FIG. 5 is a bottom view showing the structure of another embodiment of the electronic wristwatch fitted with power generators, depicting an example of electronic wristwatch fitted with power generators. FIG. 6 is a cross section taken on 6—6 of FIG. 5.

In FIGS. 5 and 6, a timepiece movement 601 including a movement, electrical storage means, an electronic timepiece circuit, a stepping motor, and hands is disposed in the center of the top of a heat-dissipating barrel 606 of an electronic wristwatch. The top is covered by a windshield glass 602. A thermoelectric generator 504 is disposed in the center of the lower portion of the electronic wristwatch. One end portion of the thermoelectric generator 504 is in contact with the heat-dissipating barrel 606, while the other end portion is in contact with a transparent rear cover 503. Solar generators 501 and 502 are disposed on both sides of the thermoelectric generator. The solar generators 501 and 502 and the thermoelectric generator 504 are covered by the rear cover 503.

The peripheral portion of the lower portion of the electronic wristwatch is made of a heat-insulating member such as plastics and is formed by a heat-insulating material 604 that blocks heat transfer on the side of the rear cover 503 and on the side of the heat-dissipating barrel 606. Thus, the two opposite end portions of the thermoelectric generator 504 are thermally isolated from each other. The rear cover 503 is made of a transparent material such as sapphire, glass, or transparent plastic to permit light to hit the solar generators 501 and 502.

Where the electronic wristwatch constructed as described thus far is worn on an arm, the body temperature on the arm is transmitted to the other end portion of the thermoelectric generator 504 via the rear cover 503. Meanwhile, one end portion is held at the outside temperature by the heat-dissipating barrel 606. The thermoelectric generator 504 produces electricity owing to a temperature difference between the body temperature and the outside temperature.

When the electronic wristwatch is detached from the arm and placed in such a way that the rear cover 503 faces upward, sunlight or other light impinges on the solar generators 501 and 502 via the rear cover 503, whereby the generators produce electricity. Since the solar generators are disposed on the side of the rear cover 503, the watch can be designed as an apparently normal watch. This is aesthetically advantageous.

As described thus far, in the embodiment of the invention, the thermoelectric generator 101 and the solar generator 103 are used in conjunction. If no temperature difference is produced across the thermoelectric generator 101, electric power generated by the solar generator 103 charges the storage means 105. Quick charging is also possible. In the dark as encountered when there exists no sunlight, it is possible to generate electricity using the thermoelectric generator 101.

Accordingly, in regions where large temperature differences are obtained between the body temperature and the outside temperature but the sunlight is weak and the hours of sunlight are short as in cold regions, the device can be chiefly charged by the thermoelectric generator 101. On the other hand, in areas where small temperature differences are produced between the body temperature and the outside temperature but the sunlight is strong and the hours of sunlight are long as in the vicinities of equatorial districts, the device can be mainly charged by the solar generator 103.

The storage means 105 can be charged without being affected by the regional environments and so on by correcting the drawbacks of the generators, which is realized by using the thermoelectric generator 101 and the solar generator 103 in combination. Therefore, the effect that decreases in the electric power stored in the storage means 105 can be suppressed is obtained.

Since the voltage generated by the thermoelectric generator 101 is relatively low, it is necessary to step up the voltage by the voltage step-up means 102. The voltage generated by the solar generator 103 is relatively high and rises steeply. The solar generator 103 is used as a power supply for driving the voltage step-up means 102. Therefore, if the electric power stored in the storage means 105 is fully consumed, it is possible to charge it by the electric power generated by the thermoelectric generator 101. Since the voltage generated by the thermoelectric generator 101 is relatively low, if the electric power stored in the storage means 105 is fully consumed, there is the possibility that the voltage step-up means 102 cannot be started. In this case, the solar generator 103 is made of one stage of cell and used as a power supply for starting the voltage step-up means 102. So that the voltage step-up means 102 is operated. By starting step-up of the voltage generated by the thermoelectric generator 101, the storage means 105 is charged. Furthermore, it can act as a power supply for the voltage step-up means 102.

The thermoelectric generator and the solar generator are used as electric power generators and so decreases in size and weight can be accomplished. Electric power can be generated in normal use, i.e., when the device is worn on an arm. Consequently, the serviceability is quite high in use.

The solar generator 103 can generate electric power under normal use conditions by disposing the solar generator 103 on the time display face of the timepiece.

Furthermore, the device can be aesthetically improved by placing the solar generator 103 on the opposite side of the time display face described above so as to be capable of receiving light via the transparent rear cover 503.

In the present embodiment, electronic wristwatches have been described. The invention can also be applied to portable communications devices, domestic electrical appliances, and so on.

In the present invention, an electrical storage means is electrically charged via a switching means by using at least one of electric power generated by a thermoelectric generator and electric power generated by a solar generator. Decreases in the electric power stored in the storage means can be suppressed.

The aforementioned solar generator is used as a power supply for driving a voltage step-up means. Therefore, if the electric power stored in the storage means is exhausted, the storage means can be charged by electric power generated by the thermoelectric generator.

Since both a thermoelectric generator and a solar generator are used as electric power generators, decreases in size and weight can be realized. Where the invention is applied to an electronic wristwatch, electric power can be generated in normal use, i.e., when the watch is worn on an arm. Hence, the serviceability is quite high in use.

Moreover, electric power can be generated in normal use by placing the solar generator on the time display face. In addition, the device can be aesthetically improved by placing the solar generator on the opposite side of the time display face.

What is claimed is:

1. An electronic device comprising: display means having a display face for displaying time; a transparent cover disposed opposite to the display face of the display means; and electronic timepiece circuit for driving the display means to display time; a thermoelectric generator for generating electric power; a pair of solar generation disposed on opposite sides of the thermoelectric generator and disposed opposite to the display face of the display means for receiving light transmitted through the transparent cover to generate electric power; switching means for outputting at least one of the electric power generated by the thermoelectric generator and the electric power generated by the solar generators; and electric power storage means for storing the electric power outputted from the switching means and for supplying the electric power to the electronic timepiece circuit.

2. An electronic device according to claim 1; further comprising voltage step-up means for stepping up a voltage generated by the thermoelectric generator utilizing electric power generated by the solar generator.

3. An electronic device according to claim 2; wherein the solar generator consists of one stage of thermoelectric cell.

4. An electronic device according to claim 1; wherein the solar generator consists of one stage of thermoelectric cell.

5. An electronic device comprising: a housing having a first transparent surface and a second transparent surface opposite to the first transparent surface; a timepiece movement disposed in the housing and having a display for displaying time through the first transparent surface of the housing; a thermoelectric generator disposed in the housing for generating electric power in response to a temperature difference across the thermoelectric generator; a pair of solar generators disposed on opposite sides of the thermoelectric generator and disposed on the second transparent surface of the housing for receiving light transmitted through the second transparent surface to generate electric power; and electrical power storage means for storing electric power generated by at least one of the thermoelectric generator and the solar generators and for supplying the electric power to the timepiece movement.

6. An electronic device according to claim 5; further comprising a switching circuit for outputting to the electric power storage means at least one of the electric power generated by the thermoelectric generator and the electric power generated by the solar generator.

7. An electronic device according to claim 5; further comprising voltage step-up means for stepping up a voltage generated by the thermoelectric generator utilizing electric power generated by the solar generator.

8. An electronic device according to claim 5; wherein the pair of solar generators are connected in series.

9. An electronic device according to claim 1; wherein the thermoelectric generator is disposed on a central portion of the transparent cover.

10. An electronic device according to claim 5; wherein the thermoelectric generator is disposed on a central portion of the second transparent surface of the housing.

* * * * *